(12) United States Patent
Kishimoto (10) Patent No.: US 7,947,377 B2
(45) Date of Patent: May 24, 2011

(54) POWDER MIXTURE TO BE MADE INTO EVAPORATION SOURCE MATERIAL FOR USE IN ION PLATING, EVAPORATION SOURCE MATERIAL FOR USE IN ION PLATING AND METHOD OF PRODUCING THE SAME, AND GAS BARRIER SHEET AND METHOD OF PRODUCING THE SAME

(75) Inventor: Yoshihiro Kishimoto, Kashiwa (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 139 days.

(21) Appl. No.: 12/141,309

(22) Filed: Jun. 18, 2008

(65) Prior Publication Data
US 2009/0000517 A1    Jan. 1, 2009

(30) Foreign Application Priority Data

Jun. 20, 2007  (JP) .................................. 2007-162497

(51) Int. Cl.
*B32B 9/00*   (2006.01)
*C09D 1/00*   (2006.01)
*C23C 14/06*  (2006.01)
*B29C 43/00*  (2006.01)

(52) U.S. Cl. ................ 428/451; 106/286.01; 106/286.4; 106/286.6

(58) Field of Classification Search .................. 428/451; 106/286.1, 286.4, 286.6
See application file for complete search history.

(56) References Cited

U.S. PATENT DOCUMENTS
5,856,017 A * 1/1999 Matsuda et al. ............. 428/446

FOREIGN PATENT DOCUMENTS
JP         2000-272044 A1   10/2000
* cited by examiner

*Primary Examiner* — D. S Nakarani
(74) *Attorney, Agent, or Firm* — Burr & Brown (57) ABSTRACT

A powder mixture to be made into an evaporation source material for use in ion plating, and an evaporation source material useful for ion plating and a method of producing it, and a gas barrier sheet and a method of producing it. The powder mixture comprises 100 parts by weight of silicon oxide powder and 5 to 100 parts by weight of a conductive material powder. Preferably, both the silicon oxide powder and the conductive material powder have a mean particle diameter of 5 μm or less. The conductive material powder is preferably a powder of at least one material selected from metals and electrically conductive metallic oxides, nitrides and acid nitrides. The evaporation source material for use in ion plating is in the form of agglomerates having a mean particle diameter of 2 mm or more, or a block, obtained by granulating or compression-molding the powder mixture.

1 Claim, 1 Drawing Sheet

POWDER MIXTURE TO BE MADE INTO EVAPORATION SOURCE MATERIAL FOR USE IN ION PLATING, EVAPORATION SOURCE MATERIAL FOR USE IN ION PLATING AND METHOD OF PRODUCING THE SAME, AND GAS BARRIER SHEET AND METHOD OF PRODUCING THE SAME

CROSS-REFERENCE TO RELATED APPLICATION

This application for patent enjoys the benefit of the right to Japanese Patent Application No. 2007-162497 filed on Jun. 20, 2007. The whole description in the Japanese patent application is incorporated herein by reference.

BACKGROUND OF THE INVENTION

1. Field of the Invention

The present invention relates to a powder mixture to be made into an evaporation source material for use in ion plating, an evaporation source material for use in ion plating and a method of producing the same, and a gas barrier sheet and a method of producing the same. More particularly, the present invention relates to a powder mixture to be made into an evaporation source material for use in ion plating, capable of forming a gas barrier film that is dense and has good adhesive properties, and to others.

2. Background Art

A gas barrier sheet having, on a substrate, a film of an inorganic oxide such as silicon oxide or aluminum oxide, serving as a gas barrier film, has been proposed as a gas barrier sheet impermeable to oxygen gas, water vapor, etc. Since gas barrier sheets of this sort are excellent in transparency and have little influence on environments, demand for them is highly expected to grow in such areas as packaging materials.

Besides vacuum vapor deposition and sputtering, ion plating is employed as a process of depositing an inorganic oxide film that serves as a gas barrier film. In terms of adhesion to substrate and denseness, a gas barrier film formed by ion plating is superior to one deposited by vacuum vapor deposition and is comparable to one formed by sputtering. On the other hand, the rate of gas barrier film deposition in ion plating is higher than that in sputtering and is nearly equal to that in vacuum vapor deposition.

A gas barrier film formed by ion plating having the above-described features is described in Japanese Laid-Open Patent Publication No. 2000-272044 (Patent Document 1), for example. Patent Document 1 (claim 1) describes a transparent barrier film that is a thin film formed by ion plating using as a source $SiO_x$ ($0 \leq x \leq 2$), composed mainly of silicon oxide ($SiO_y$, ($1.5 \leq y \leq 2$)), having an oxygen permeability of 0.02-0.5 cc/m²·day.

Silicon oxide materials are inexpensive. They are therefore suitable for use as gas barrier films in such areas as packaging materials for foods and the like in which there is a demand for reduction in cost.

The gas barrier film described in Patent Document 1 has the required gas barrier properties. In recent years, however, demands for packaging materials of better performance have become stronger than ever, and the present goal in this area is making an overall improvement in gas barrier properties by suppressing not only oxygen permeability but also water vapor permeability. For example, also in such areas as foods in which packaging materials require a large reduction in cost, there is a growing demand for development of gas barrier sheets having more excellent gas barrier properties than ever, without an increase in cost.

The present invention was accomplished in order to fulfil the above-described goal in the art. An object of the present invention is therefore to provide a powder mixture to be made into an evaporation source material for use in ion plating, capable of forming a gas barrier film that is dense and is excellent in gas barrier properties, while keeping the cost low. More specifically, an object of the present invention is to provide a powder mixture to be made into an evaporation source material useful for ion plating, an evaporation source material for use in ion plating and a method of producing it, and a gas barrier sheet and a method of producing it.

SUMMARY OF THE INVENTION

In the course of studies we made in order to produce gas barrier sheets having enhanced gas barrier properties without increasing costs, we found that it is possible to obtain significantly enhanced gas barrier properties by improving evaporation source materials to be used in ion plating.

A powder mixture to be made into an evaporation source material for use in ion plating, that fulfils the above object of the invention, is characterized by comprising 100 parts by weight of silicon oxide powder having a mean particle diameter of 5 μm or less and 5 parts by weight or more and 100 parts by weight or less of a conductive material powder having a mean particle diameter of 5 μm or less.

According to the present invention, the powder mixture to be made into an evaporation source material for use in ion plating comprises 100 parts by weight of silicon oxide powder and 5 parts by weight or more and 100 parts by weight or less of a conductive material powder, so that when an evaporation source material obtained by compression-molding or granulating the powder mixture is used in ion plating as a source, plasma injected for film deposition concentrates at the evaporation source material and easily penetrates into it via the conductive material, causing efficiently the excitation of the evaporation source material. Consequently, there is deposited a gas barrier film having significantly enhanced gas barrier properties. It is preferred that the mean particle diameter of the silicon oxide powder be 100 μm or less, and that the mean particle diameter of the conductive material powder be 100 μm or less. It is more preferred that the mean particle diameter of the silicon oxide powder be 5 μm or less, and that the mean particle diameter of the conductive material powder be 5 μm or less.

In the powder mixture of the invention, to be made into an evaporation source material for use in ion plating, when the powder mixture is made into an evaporation source material for use in ion plating by granulation, it is preferred that the silicon oxide powder have a specific surface area of 600 m²/g or larger.

According to this invention, since the silicon oxide powder has a specific surface area of 600 m²/g or more, it can easily adsorb the conductive material powder that is mixed with it, and Si-conductive material network is satisfactorily incorporated in Si—O network. On the other hand, when the powder mixture is made into an evaporation source material for use in ion plating by compression molding, it is preferred that the silicon oxide powder have a specific surface area of 1 to 60 m²/g.

In the powder mixture of the invention, to be made into an evaporation source material for use in ion plating, it is preferred that the conductive material powder comprise at least one material selected from metals and electrically conductive metallic oxides, nitrides and acid nitrides. It is more preferred that the conductive material powder comprise zinc oxide or tin oxide.

According to this invention, the conductive material powder comprises at least one material selected from metals and electrically conductive metallic oxides, nitrides and acid nitrides, so that, when an evaporation source material is produced by heating or sintering the powder mixture, the conductive material is hardly oxidized in the heating or sintering step and tends to remain in the silicon oxide while maintaining its conductivity, which makes it easy to control the composition of the evaporation source material.

A method of the present invention, for producing an evaporation source material for use in ion plating, that fulfils the above object of the invention, is characterized by comprising the steps of preparing a powder mixture comprising 100 parts by weight of silicon oxide powder having a mean particle diameter of 5 μm or less and 5 parts by weight or more and 100 parts by weight or less of a conductive material powder having a mean particle diameter of 5 μm or less, and granulating or compression-molding the powder mixture into an evaporation source material for use in ion plating, in a predetermined form.

According to this invention, the production method comprises the steps of preparing the above-described powder mixture to be made into an evaporation source material for use in ion plating, and granulating or compression-molding the powder mixture into an evaporation source material in a predetermined form, so that when the evaporation source material obtained by granulation or compression molding is used as a source in ion plating, plasma injected for film deposition concentrates at the evaporation source material and easily penetrates into it via the conductive material, causing efficiently the excitation of the evaporation source material. Consequently, there is deposited a gas barrier film having significantly enhanced gas barrier properties. It is preferred that the mean particle diameter of the silicon oxide powder be 100 μm or less, and that the mean particle diameter of the conductive material powder be 100 μm or less. It is more preferred that the mean particle diameter of the silicon oxide powder be 5 μm or less, and that the mean particle diameter of the conductive material powder be 5 μm or less.

In the method of the present invention, for producing an evaporation source material for use in ion plating, it is preferred that the step of making the powder mixture into an evaporation source material in a predetermined form comprise the step of granulating or compression-molding the silicon oxide powder and the conductive material powder, the components of the powder mixture, into agglomerates having a mean particle diameter of 2 mm or more, or a block. Further, in the production method, it is preferred that the step of making the powder mixture into an evaporation source material in a predetermined form further comprise the step of heating the agglomerates or block obtained by granulation or compression molding. Alternatively, it is preferred that the step of making the powder mixture into an evaporation source material in a predetermined form further comprise the step of sintering the agglomerates or block obtained by granulation or compression molding.

According to this invention, in the step of making the powder mixture into an evaporation source material in a predetermined form, since the silicon oxide powder and the conductive material powder, the components of the powder mixture, are granulated or compression-molded into agglomerates having a mean particle diameter of 2 mm or more, or a block, the evaporation source material obtained is hardly scattered when vaporized.

An evaporation source material of the invention, for use in ion plating, that fulfils the object of the invention, is in the form of agglomerates having a mean particle diameter of 2 mm or more, or a block, obtained by granulating or compression-molding a powder mixture comprising 100 parts by weight of silicon oxide powder having a mean particle diameter of 5 μm or less and 5 parts by weight or more and 100 parts by weight or less of a conductive material powder having a mean particle diameter of 5 μm or less.

According to this invention, the evaporation source material is in the form of agglomerates having a mean particle diameter of 2 mm or more, or a block, obtained by granulating or compression-molding a powder mixture comprising 100 parts by weight of silicon oxide powder and 5 parts by weight or more and 100 parts by weight or less of a conductive material powder, so that, when it is used as a source in ion plating, plasma injected for film deposition concentrates at the evaporation source material and easily penetrates into it via the conductive material, causing efficiently the excitation of the evaporation source material. Consequently, there is deposited a gas barrier film having significantly enhanced gas barrier properties. Although some manufacturers of materials for use in vacuum deposition have developed evaporation source materials for use in ion plating, most of these materials are merely modifications of materials for use as sources in vacuum vapor deposition or as targets in sputtering. It is the present situation that there have not yet been proposed evaporation source materials for use in ion plating, capable of forming films improved in film quality. It is preferred that the mean particle diameter of the silicon oxide powder be 100 μm or less, and that the mean particle diameter of the conductive material powder be 100 μm or less. It is more preferred that the mean particle diameter of the silicon oxide powder be 5 μm or less, and that the mean particle diameter of the conductive material powder be 5 μm or less.

In the evaporation source material of the invention, for use in ion plating, it is preferred that the conductive material powder comprise at least one material selected from metals and electrically conductive metallic oxides, nitrides and acid nitrides. It is more preferred that the conductive material powder comprise zinc oxide or tin oxide.

According to this invention, the conductive material powder comprises at least one material selected from metals and electrically conductive metallic oxides, nitrides and acid nitrides, so that, when the evaporation source material is produced from the powder mixture by heating or sintering, the conductive material is hardly oxidized in the heating or sintering step and tends to remain in the silicon oxide while maintaining its conductivity, which makes it easy to control the composition of the evaporation source material.

A method of the present invention, for producing a gas barrier sheet, that fulfils the above object of the invention, is characterized by comprising the steps of preparing an evaporation source material for use in ion plating, in a predetermined form, by compression-molding or granulating a powder mixture comprising 100 parts by weight of silicon oxide powder having a mean particle diameter of 5 μm or less and 5 parts by weight or more and 100 parts by weight or less of a conductive material powder having a mean particle diameter of 5 μm or less, and depositing a gas barrier film on a substrate by ion plating using as a source the evaporation source material.

According to this invention, the production method comprises the steps of preparing the above-described evaporation source material for use in ion plating and depositing a gas barrier film on a substrate by ion plating using as a source the evaporation source material. In particular, the evaporation source material of the invention is used in the production method, so that plasma injected for film deposition concentrates at the evaporation source material and easily penetrates into it via the conductive material, causing efficiently the excitation of the evaporation source material. Consequently, there is deposited a gas barrier film having significantly enhanced gas barrier properties. It is preferred that the mean particle diameter of the silicon oxide powder be 100 μm or less, and that the mean particle diameter of the conductive material powder be 100 μm or less. It is more preferred that the mean particle diameter of the silicon oxide powder be 5 μm or less, and that the mean particle diameter of the conductive material powder be 5 μm or less.

In the method of the present invention, for producing a gas barrier sheet, it is preferred that the conductive material powder comprise at least one material selected from metals and electrically conductive metallic oxides, nitrides and acid nitrides.

According to this invention, the conductive material powder comprises at least one material selected from metals and electrically conductive metallic oxides, nitrides and acid nitrides, so that, when the evaporation source material is produced from the powder mixture by heating or sintering, the conductive material is hardly oxidized in the heating or sintering step and tends to remain in the silicon oxide while maintaining its conductivity, which makes it easy to control the composition of the evaporation source material.

A gas barrier sheet of the present invention, that fulfils the above-described object of the invention, comprises a substrate and a gas barrier film formed at least on one side of the substrate, and the gas barrier film is Si—O—Zn film in which the number of Si atoms, that of O atoms and that of Zn atoms are in the ratio of 100:(200-500):(2-100), the ratio being constant along the thickness of the film.

According to this invention, the gas barrier film is Si—O—Zn film in which the number of Si atoms, that of O atoms and that of Zn atoms are in the ratio of 100:(200-500):(2-100), and this number-of-atoms ratio is constant (scattering: within ±10%) along the thickness of the film, so that the gas barrier sheet has the gas barrier film having film quality uniform along the thickness of the film. The gas barrier sheet is therefore significantly excellent in gas barrier properties. The number-of-atoms ratio is herein on a bulk basis.

A gas barrier sheet of the present invention, that fulfils the above-described object, comprises a substrate and a gas barrier film formed at least on one side of the substrate, and the gas barrier film is Si—O—Sn film in which the number of Si atoms, that of O atoms and that of Sn atoms are in the ratio of 100:(150-400):(2-60), the ratio being constant along the thickness of the film.

According to this invention, the gas barrier film is Si—O—Sn film in which the number of Si atoms, that of O atoms and that of Sn atoms are in the ratio of 100:(150-400):(2-60), and this number-of-atoms ratio is constant along the thickness of the film, so that the gas barrier sheet has the gas barrier film having film quality uniform along the thickness of the film. The gas barrier sheet is therefore significantly excellent in gas barrier properties. The number-of-atoms ratio is herein on a bulk basis.

According to the powder mixture of the invention, to be made into an evaporation source material for use in ion plating, when an evaporation source material obtained by compression-molding or granulating the powder mixture is used as a source in ion plating, plasma injected for film deposition concentrates at the evaporation source material and easily penetrates into it via the conductive material, causing efficiently the excitation of the evaporation source material. Consequently, there is deposited a gas barrier film having significantly enhanced gas barrier properties.

According to the method of the invention, for producing an evaporation source material for use in ion plating, when an evaporation source material obtained by compression-molding or granulating the powder mixture is used as a source in ion plating, plasma injected for film deposition concentrates at the evaporation source material and easily penetrates into it via the conductive material, causing efficiently the excitation of the evaporation source material. Consequently, there is deposited a gas barrier film having significantly enhanced gas barrier properties.

According to the evaporation source material of the invention, for use in ion plating, plasma injected for film deposition concentrates at the evaporation source material and easily penetrates into it via the conductive material, causing efficiently the excitation of the evaporation source material. Consequently, there is deposited a gas barrier film having significantly enhanced gas barrier properties. Although some manufacturers of materials for use in vacuum deposition have developed evaporation source materials for use in ion plating, most of these materials are merely modifications of materials for use as sources in vacuum vapor deposition or as targets in sputtering. It is the present situation that there have not yet been proposed evaporation source materials for use in ion plating, capable of forming films improved in film quality.

According to the method of the present invention, for producing a gas barrier sheet, since the evaporation source material of the invention is used in ion plating, plasma injected for film deposition concentrates at the evaporation source material and easily penetrates into it via the conductive material, causing efficiently the excitation of the evaporation source material. Consequently, there is deposited a gas barrier film significantly enhanced in gas barrier properties.

According to the gas barrier sheet of the present invention, since it has a gas barrier film having film quality uniform along the thickness of the film, as well as high density, denseness and excellent adhesive properties, it can exhibit extremely excellent gas barrier properties.

DETAILED DESCRIPTION OF THE INVENTION

Embodiments of the present invention will be described hereinafter in detail. However, the present invention is not limited to the following embodiments and is susceptible to modifications without departing from the spirit of this disclosure and the scope of the appended claims.

(Powder Mixture to be Made into Evaporation Source Material for Use in Ion Plating)

A powder mixture of the invention, to be made into an evaporation source material for use in ion plating (sometimes referred to simply as a "powder mixture" in this specification) is a powder mixture to be made into an evaporation source that is used in ion plating as a source of atoms to be ionized. Specifically, the powder mixture comprises 100 parts by weight of silicon oxide powder having a mean particle diameter of 100 μm or less, preferably 5 μm or less, and 5 parts by weight or more and 100 parts by weight or less of a conductive material powder having a mean particle diameter of 100 μm or less, preferably 5 μm or less.

When an evaporation source material made from the above powder mixture is used as a source in ion plating, plasma injected for film deposition concentrates at the evaporation source material and easily penetrates into it via the conductive material, causing efficiently the excitation of the evaporation source material. Consequently, there is deposited a gas barrier film having significantly enhanced gas barrier properties. The following is the possible reason why the evaporation source material obtained from the powder mixture by compression molding or granulation has the above-described effects on gas barrier film deposition.

In the present invention, since a conductive material is used together with silicon oxide, an insulating material, to produce an evaporation source material, plasma injected from a plasma gun easily concentrates at the evaporation source material. If a single insulating material, such as silicon oxide, is exposed to plasma, the charge on its surface increases, and the plasma discharges to the non-floating parts (earth-potential parts) of a deposition chamber and becomes unstable. Consequently, it becomes difficult to conduct film deposition continuously. In the present invention, on the other hand, a conductive material is present in the evaporation source material, so that plasma easily concentrates at the evaporation source material, which makes it easy to conduct film deposition continuously.

Furthermore, in the present invention, since silicon oxide powder having a mean particle diameter of 100 μm or less, preferably 5 μm or less, is mixed with a specified amount of a conductive material powder having a mean particle diameter of 100 μm or less, preferably 5 μm or less, there can be obtained a powder mixture excellent in uniformity of dispersion. It is therefore assumed that, also in the evaporation source material for use in ion plating, obtained from the powder mixture, the conductive material is dispersed uniformly in the silicon oxide. The conductive material uniformly dispersed in the evaporation source material makes plasma easily penetrate into the evaporation source material.

It is assumed that the concentration of plasma at the evaporation source material and the penetration of plasma into the evaporation source material synergically act to excite efficiently the evaporation source material. It is also assumed that, since the evaporation source material is efficiently excited, the rate of ionization increases, which makes it possible to obtain a gas barrier film having greatly improved film quality.

An evaporation source material that sublimes, i.e., undergoes a direct change in state from solid to gas, when exposed to plasma is usually used in ion plating. This is because a material that undergoes a change in state from solid to gas via liquid when exposed to plasma is at a disadvantage in that it makes the rate of film deposition lower to increase deposition time, since it becomes liquid before becoming gaseous. In the course of our studies, we found the following. Of silicon oxide materials, especially silicon dioxide has the property of undergoing a change in state from solid to gas via liquid when exposed to plasma, and an evaporation source material composed of a combination of silicon dioxide and a conductive material is more readily melted and shows the increased tendency to be vaporized after becoming liquid. Therefore, the use of a conductive material together with silicon oxide seems to be inadequate from the viewpoint of increase in the rate of film deposition and decrease in deposition time in ion plating. However, we found the following in the course of our studies. When a conductive material is incorporated in an evaporation source material, plasma injected from a plasma gun comes to concentrate at the evaporation source material and the output of the plasma is thus stabilized, which makes continuous film deposition easier. In addition to this, we also found the following. Since the small-particle-sized conductive material incorporated in the evaporation source material accelerates melting of the evaporation source material, the plasma injected penetrates more fully into the evaporation source material, and the evaporation source material is thus excited efficiently. Consequently, the deposited gas barrier film has significantly enhanced gas barrier properties. Such a significant enhancement of gas barrier properties is very advantageous to a gas barrier sheet.

Any powder can be used as the silicon oxide powder as long as it is a powder of a compound consisting of silicon and oxygen, and silicon dioxide powder is preferably used in the present invention. Silicon dioxide powder can be represented by the chemical formula $SiO_x$ (x=1.8 to 2.2), typically by $SiO_2$. The silicon oxide powder is in powder form, and more specifically, it is a powder having a mean particle diameter of 100 μm or less, preferably 5 μm or less. The "mean particle diameter" herein is a value obtained from measurements on apparatus for particle size distribution measurement (the Coulter Counter method), using as a sample a specified amount, e.g., 1 g, of a powder. Although the silicon oxide powder may contain small amounts of impurities and other elements, its purity is usually as high as 99.9% or more in the present invention.

Any powder can be used as the conductive material powder as long as it is a powder of a material having electrical conductivity, and a powder of an inorganic material is preferably used in the invention. Examples of conductive materials useful herein include materials whose volume resistivity values are 1.4 μΩ·cm or more and 1 kΩ·cm or less. In the present invention, the volume resistivity is determined by the testing method using a four-point prove array, specified in JIS-K7194. Examples of conductive materials having volume resistivity values in the above range include metals, alloys, and electrically conductive compounds.

First, the case where a metal or alloy is used as the conductive material will be described. In this case, it is preferable to pay attention to the following points according to the type of the metal or alloy to be used and to the method to be employed to produce the evaporation source material. As will be described later, an evaporation source material of the present invention can be obtained by granulating or compression-molding the powder mixture into a predetermined form and heating or sintering the granulated or compression-molded one. When the evaporation source material is obtained by heating or sintering from the powder mixture containing as the conductive material powder a metal or alloy, it is desirable to control the degree of oxidization of the metal or alloy according to its type. More specifically, a metal or alloy tends to react with oxygen either in the air or in the silicon oxide to cause oxidation in the heating or sintering step. For this reason, it is preferred that the metal or alloy to be used in the powder mixture be a material that retains conductivity when slightly oxidized, or a material that retains conductivity even when considerably oxidized.

The material that retains conductivity when slightly oxidized is at least one material selected from such metals as aluminum, silicon, copper, silver, nickel, chromium, gold, white gold, indium, tin, zinc, gallium and germanium, and alloys of these metals. For example, of the above metals and alloys, aluminum comes to have insulating properties when oxidized to $Al_2O_3$. However, by feeding to aluminum only a small amount of oxygen, it is possible to maintain the conductivity of aluminum. Therefore, in the case where a metal or alloy that retains conductivity when oxidized slightly is used, it is possible to ensure the electrical conductivity of the conductive material contained in the evaporation source material by controlling various conditions such as the heating or sintering temperature and the atmosphere in which the heating or sintering step is performed. Of the above metals and alloys, gold, silver, copper, white gold, indium, tin and zinc, and alloys of these metals are preferred from the viewpoint of electrical conductivity, and aluminum, tin and zinc are preferred from the viewpoint of cost.

Examples of the material that retains conductivity even when considerably oxidized include such metals as indium, zinc, tin and cerium, and alloys of these metals. Of these metals and alloys, zinc itself is conductive, and zinc oxide (ZnO) is also conductive. It is therefore possible to ensure the electrical conductivity of the conductive material contained in the evaporation source material obtained by heating or sintering, without controlling the degree of oxidization of the conductive material. For this reason, when such a metal or alloy is used, there is no need to control the degree of its oxidization. Of the above-described materials, indium, zinc and tin, and alloys of these metals are preferred from the viewpoint of conductivity, and zinc and zinc alloys are preferred from the viewpoint of cost.

On the other hand, in the case where an evaporation source material is obtained by granulating the powder mixture into a predetermined form, there is sometimes no need to take oxidation of the metal or alloy into consideration. For example, when the powder mixture is granulated by such a method as pressing, without conducting heating or sintering, the above-described influence of oxidization can be minimized. Even when heating or sintering is conducted, if it is conducted in an inert gas or in vacuum, the influence of oxidization can be minimized. For this reason, a metal or alloy selected from a wide variety of materials can be used irrespective of whether it retains conductivity when oxidized slightly or even when oxidized considerably. Specifically, such a material can be selected from the above-enumerated metals and alloys.

Next, the case where an electrically conductive compound is used as the conductive material will be described. Preferably, the conductive compound is at least one selected from electrically conductive metallic oxides, nitrides and acid nitrides. Metallic oxides or nitrides include double oxides or nitrides that are oxides or nitrides of two or more metallic elements. The same applies to metallic acid nitrides. Since such a conductive compound is mostly in the state of being oxidized and/or nitrided and chemically stable, it is hardly oxidized in the heating or sintering step in the production of the evaporation source material and tends to remain in the silicon oxide while maintaining its conductivity. This makes it easy to control the composition of the evaporation source material. From the viewpoint of conductivity and stability, it is preferable to use, as the conductive compound, an oxide, nitride or acid nitride of at least one metal selected from indium, zinc, tin, and cerium, more preferably from indium, zinc, and tin. More specific examples of such conductive materials are preferably tin oxide, zinc oxide, and ITO.

Of the above-described conductive materials, a metal or alloy that retains conductivity even when oxidized considerably, or a conductive compound, is preferably used to produce an evaporation source material by heating or sintering the powder mixture. This is because it is not necessary to control the oxidation of such a material and is easy to control the composition of the evaporation source material to be produced, which is convenient for industrial production.

The conductive material powder is in powder form. More specifically, it is a powder having a mean particle diameter of 100 μm or less, preferably 5 μm or less. The mean particle diameter of the conductive material powder is determined by the same method as is used to determine the mean particle diameter of the silicon oxide powder. Although the conductive material powder may contain small amounts of impurities and other elements, its purity is usually as high as 99.9% or more in the present invention.

In the powder mixture of the invention, both the mean particle diameter of the silicon oxide powder and that of the conductive material powder are 100 μm or less, preferably 5 μm or less, more preferably 3 μm or less. As long as the two powders have mean particle diameters in the above range, it is easy to mix them with each other, and there can be obtained a powder mixture without non-uniformity in dispersion. In a small portion (unit volume) of an evaporation source material produced by compression-molding or granulating such a powder mixture, the fine silicon oxide powder and the fine conductive material powder are uniformly dispersed, and the individual powder can be well exposed to plasma that occurs in an ion-plating device. Particularly within the evaporation source material, the conductive material is present in the silicon oxide, so that plasma injected from a plasma gun concentrates at the evaporation source material. In addition to this, since the conductive material is uniformly mixed with the silicon oxide, the plasma injected for film deposition easily penetrates into the evaporation source material via the conductive material, causing efficiently the excitation of the evaporation source material. It is therefore easy to obtain a gas barrier film having significantly enhanced gas barrier properties.

Although the mean particle diameter of the silicon oxide powder and that of the conductive material powder have no particular lower limit, the lower limit is preferably 0.2 μm. When the two powders have mean particle diameters of 0.2 μm or more, they are hardly scattered when mixed with each other or when the powder mixture consisting of the two powders is compression-molded or granulated, which brings about increase in productivity.

On the other hand, when both of, or either one of the mean particle diameter of the silicon oxide powder and that of the conductive material powder is in excess of 5 μm, the two powders are not fully dispersed when mixed with each other. Therefore, even when the powder mixture obtained is compression-molded or granulated into an evaporation source material for use in ion plating, the fine silicon oxide powder and the fine conductive material powder cannot be uniformly present in a small portion (unit volume) of the evaporation source material, so that it becomes difficult to obtain the effects of the evaporation source material, i.e., the concentration of plasma at the evaporation source material and the penetration of plasma into the evaporation source material via the conductive material. Thus, when the two powders have greater mean particle diameters, the evaporation source material is excited less sufficiently.

Preferably, the powder mixture of the invention, to be made into an evaporation source material for use in ion plating, is composed mainly of silicon oxide powder. The reason for this is as follows. Since silicon oxide powder is inexpensive, the use of it makes possible to produce a powder mixture, an evaporation source material and a gas barrier sheet at decreased cost. Silicon oxide powder can therefore be used favorably in such areas as the food industries in which there is an insistent demand for reduction in the cost of packaging materials. In the powder mixture of the invention, to be made into an evaporation source material for use in ion plating, a specified amount of the conductive material powder is used together with the silicon oxide powder, in order to obtain a gas barrier film having enhanced gas barrier properties by making use of the effects of the conductive material, i.e., the concentration of plasma at the evaporation source material and the penetration of plasma into the evaporation source material via the conductive material. Taking these effects into account, the content of the conductive material powder in the powder mixture is set to 5 parts by weight or more, preferably 10 parts by weight or more, more preferably 30 parts by weight or more, and 100 parts by weight or less, preferably 80 parts by weight or less, and more preferably 70 parts by weight or less, for 100 parts by weight of the silicon oxide powder. When ion plating is conducted using the evaporation source material made from the powder mixture containing the conductive material powder in an amount of the above range, plasma fully concentrates at the evaporation source material due to the conductive material present in the evaporation source material, and readily penetrates into the evaporation source material via the conductive material, as described above. Consequently, the evaporation source material is excited efficiently, and there can thus be easily obtained a gas barrier film having excellent gas barrier properties.

When the content of the conductive material powder in the powder mixture is less than 5 parts by weight for 100 parts by weight of the silicon oxide powder, the effects of addition of the conductive material (i.e., the concentration of plasma at the evaporation source material, and the satisfactory penetration of plasma into the evaporation source material) may not be easily obtained. On the other hand, when the content of the conductive material powder in the powder mixture is more than 100 parts by weight for 100 parts by weight of the silicon oxide powder, the gas barrier film obtained is often colored, e.g., brown-colored, and is hard. Therefore, 100 parts by weight for 100 parts by weight of the silicon oxide powder is adequate as the upper limit of the conductive material content, if a gas barrier film is deposited on a transparent substrate, or if the intended gas barrier sheet is flexible one.

If a granulation process is employed in the method of producing an evaporation source material for use in ion plating, which will be described later, it is preferred that the silicon oxide powder have a specific surface area of 600 $m^2/g$ or more. When the silicon oxide powder has a specific surface area of 600 $m^2/g$ or more, it can easily adsorb the conductive material powder mixed with it, and Si-conductive material network can be readily incorporated in Si—O network. For example, silicon oxide powder having a specific surface area of 600 $m^2/g$ or more has a greater number of functional groups (silanol groups) in primary particles and thus has a greater number of adsorption sites, as compared to the same volume of silicon oxide powder whose specific surface area is less than 600 $m^2/g$. Silicon oxide powder having a specific surface area of less than 600 $m^2/g$ tends to adsorb only insufficiently the conductive material mixed with it, and Si-conductive material network is sometimes not fully incorporated in Si—O network. Further, such silicon oxide powder is not easily solidified even when granulated, so that it is sometimes impossible to obtain an evaporation source material in the form of the desired agglomerates or block. In the present invention, the specific surface area is measured with an automatic specific surface area meter (the nitrogen adsorption method, the BET equation) using as a sample a specified amount (e.g., 1 g) of a powder.

Whether Si-conductive material network has been satisfactorily incorporated in Si—O network or not can be known by evaluating the film quality of the gas barrier film obtained by ion plating. That the Si-conductive material network is satisfactorily incorporated in the Si—O network is confirmed if the conductive material or the component elements thereof are uniformly distributed in the gas barrier film, and, moreover, the gas barrier film is dense. The specific surface area of the silicon oxide powder is preferably 800 $m^2/g$ or more. Although the specific surface area has no particular upper limit, silicon oxide powders having specific surface areas of up to 1000 $m^2/g$ can be used in the present invention.

On the other hand, in the case where a compression molding process such as CI press is used in the method of producing an evaporation source material for use in ion plating, which will be described later, it is preferred that the specific surface area of the silicon oxide powder be from 1 to 60 $m^2/g$. The use of silicon oxide powder having a specific surface area of 1-60 $m^2/g$ makes it easier to produce, by compression molding, an evaporation source material for use in ion plating, in a predetermined shape.

As described above, according to the powder mixture of the invention, to be made into an evaporation source material for use in ion plating, when an evaporation source material produced by compression-molding or granulating the powder mixture is used as a source in ion plating, plasma injected for film deposition concentrates at the evaporation source material and easily penetrates into it via the conductive material, causing efficiently the excitation of the evaporation source material. Consequently, there is deposited a gas barrier film having significantly enhanced gas barrier properties.

(Evaporation Source Material for Use in Ion Plating)

An evaporation source material of the invention is for use in ion plating as a source of atoms to be ionized, and it is obtained by compression-molding or granulating the above powder mixture of the invention. Specifically, the evaporation source material is in the form of agglomerates having a mean particle diameter of 2 mm or more, or a block, obtained by granulating or compression-molding a powder mixture comprising 100 parts by weight of silicon oxide powder having a mean particle diameter of 100 µm or less, preferably 5 µm or less, and 5 parts by weight or more and 100 parts by weight or less of a conductive material powder having a mean particle diameter of 100 µm or less, preferably 5 µm or less.

The evaporation source material in the form of agglomerates having a mean particle diameter of 2 mm or more, or of a block is good enough to fulfil the object of the invention, and the mean particle diameter is preferably 5 mm or more and has no particular upper limit. Therefore, the evaporation source material may be in the form of agglomerates having a mean particle diameter of about 2 mm, or even in the form of a block whose size is as large as 10 mm, 50 mm, etc. The reason why the mean particle diameter of agglomerates constituting the evaporation source material is set to 2 mm or more is as follows. Since particles having a mean particle diameter of less than 2 mm are very small, an evaporation source material composed of such fine particles is easily scattered by the impact of plasma injection in an ion-plating device. Moreover, placing such an evaporation source material on a boat (hearth) in an ion-plating device often requires careful handling. The mean particle diameter has no particular upper limit, but is about 200 mm, if any. Particles with any large mean particle diameter can be used herein as long as they can be contained in the material introduction port (hearth) of a deposition chamber. Furthermore, the particles of the evaporation source material may be in any shape; they may be circular, elliptic, or rectangular, for example. A variety of granulation or compression molding processes can be employed to produce an evaporation source material in the form of agglomerates or a block. The "mean particle diameter" of the evaporation source material is a value obtained from measurements on apparatus for particle diameter distribution measurement (the Coulter Counter method), using as a sample a specified amount (e.g., 1 g) of a powder, like the mean particle diameter of the powder mixture, as described above.

The elements constituting the silicon oxide powder and the elements constituting the conductive material powder are in the form of secondary particles and are distributed uniformly in the evaporation source material. Due to the actions of the elements constituting the conductive material powder, plasma injected for film deposition concentrates at the evaporation source material, and easily penetrates into it via the conductive material, causing efficiently the excitation of the evaporation source material. The gas barrier film deposited, therefore, has enhanced gas barrier properties.

Preferably, the powder mixture of the invention, to be made into an evaporation source material for use in ion plating, is composed mainly of silicon oxide powder. The reason for this is as follows. Since silicon oxide powder is inexpensive, the use of it makes it possible to produce a powder mixture, an evaporation source material, and a gas barrier sheet at decreased cost. Silicon oxide powder can therefore be used favorably in such areas as the food industries in which there is an insistent demand for reduction in the cost of packaging materials. In the powder mixture of the invention, to be made into an evaporation source material for use in ion plating, a specified amount of a conductive material powder is used together with the silicon oxide powder, in order to obtain a gas barrier film with enhanced gas barrier properties by making use of the effects of the conductive material, that is, the concentration of plasma at the evaporation source material and the penetration of plasma into the evaporation source material via the conductive material. Taking these effects into account, the content of the conductive material powder in the evaporation source material is set to 5 parts by weight or more, preferably 10 parts by weight or more, more preferably 30 parts by weight or more, and 100 parts by weight or less, preferably 80 parts by weight or less, and more preferably 70 parts by weight or less, for 100 parts by weight of the silicon oxide powder. When ion plating is conducted using such an evaporation source material, there can be satisfactorily obtained the above-described effects of the conductive material, that is, plasma injected concentrates at the evaporation source material and easily penetrates into it via the conductive material. On the other hand, when the content of the conductive material powder in the evaporation source material is less than 5 parts by weight for 100 parts by weight of the silicon oxide powder, it is not easy to obtain the above effects. And when the content of the conductive material powder in the evaporation source material is more than 100 parts by weight for 100 parts by weight of the silicon oxide powder, the gas barrier film obtained is often colored, e.g., brown-colored, and is hard. Therefore, 100 parts by weight for 100 parts by weight of the silicon oxide powder is adequate as an upper limit of the conductive material content, if a gas barrier film is deposited on a transparent member, or if the intended gas barrier sheet is flexible one.

Except for the above-described points, the features of the evaporation source material are the same as those mentioned in the above description of the powder mixture. For example, the conductive material in the evaporation source material is preferably at least one compound selected from electrically conductive metallic oxides, nitrides and acid nitrides, as mentioned before. Therefore, those points that have already been referred in the description of the powder mixture will not be described any more.

According to the evaporation source material of the invention for use in ion plating, plasma injected from a plasma gun concentrates at the evaporation source material in an ion-plating device and easily penetrates into it via the conductive material, causing efficiently the excitation of the evaporation source material. Consequently, there is deposited a gas barrier film having significantly enhanced gas barrier properties. Although some manufacturers of materials for use in vapor deposition have developed evaporation source materials for use in ion plating, most of these materials are merely modifications of materials for use as sources in vacuum vapor deposition or as targets in sputtering. It is the present situation that there have not yet been proposed evaporation source materials for use in ion plating, capable of forming films improved in film quality.

(Method of Producing Evaporation Source Material for Use in Ion Plating)

A method of producing an evaporation source material for use in ion plating (sometimes referred to simply as a "method of producing an evaporation source material" in this specification) of the invention comprises the steps of preparing the above-described powder mixture of the invention, and compression-molding or granulating the powder mixture into an evaporation source material for use in ion plating, in a predetermined form.

As mentioned in the above description of the powder mixture, the step of preparing the powder mixture is the step of preparing a powder mixture to be made into an evaporation source material for use in ion plating, comprising 100 parts by weight of silicon oxide powder having a mean particle diameter of 100 μm or less, preferably 5 μm or less, and 5 parts by weight or more and 100 parts by weight or less of a conductive material powder having a mean particle diameter of 100 μm or less, preferably 5 μm or less. In this step, 5 parts by weight or more and 100 parts by weight or less of a conductive material powder is mixed with 100 parts by weight of silicon oxide powder by means of mixing, such as a mixer.

Although the step of making the powder mixture into an evaporation source material in a predetermined form can be performed in any manner, it is preferred that this step comprise the step of granulating or compression-molding the silicon oxide powder and the conductive material powder, the components of the powder mixture, into agglomerates having a mean particle diameter of 2 mm or more, or a block. The evaporation source material produced in this manner is less scattered when vaporized. Further, it is preferred that the step of making the powder mixture into an evaporation source material in a predetermined form further comprise, after the step of granulating or compression-molding the silicon oxide powder and the conductive material powder into agglomerates or a block, the step of heating or sintering the agglomerates or block.

A variety of conventional techniques, such as metal mold press, CI press (cold isostatic press), and RI press (rubber isostatic press), can be employed to compression-mold the powder mixture into a predetermined shape. Of these, CI press is most preferred in the invention. In the heating or sintering step, there can be employed any conventional means of heating or sintering with which the compression-molded material can be heated to a temperature lower than the melting points of its component powders, thereby combining the powders.

The heating or sintering step can be performed at any temperature in the range from preferably 500° C., more preferably 750° C., to preferably 1500° C., more preferably 1200° C. By performing the heating or sintering step at a temperature in the above range, it is possible to degas the powder mixture satisfactorily and make it into agglomerates having a mean particle diameter of 2 mm or more, or a block. When the heating or sintering step is performed at a temperature of less than 500° C., the powder mixture cannot be heated or sintered satisfactorily, so that it may not become agglomerates having a mean particle diameter of 2 mm or more, or a block. On the other hand, when the heating or sintering step is performed at a temperature of more than 1500° C., the conductive material is sometimes oxidized excessively. In the present invention, the word "sintering" means that a powder mixture is heated so that its component powders are combined with each other, thereby causing volume shrinkage in the powder mixture to make it dense. Although the powder mixture can be heated at a temperature at which sintering occurs, or higher, it may be heated at a temperature lower than the sintering temperature, thereby degassing it without causing sintering.

Various granulation techniques such as agitation granulation, fluidized bed granulation and extrusion granulation can be used as a means of granulation. Specifically, agitation granulation is a method for producing nearly spherical agglomerates, in which a powder is placed in a vessel, a liquid binder is added to the stirred powder to agglomerate it, and the agglomerates produced are dried. Fluidized bed granulation is a method for producing relatively bulky agglomerates, in which while blowing hot air from the bottom of a vessel in which a powder is placed, a binder is sprayed over the powder slightly floating in the air, thereby agglomerating the powder, and, at the same time, drying the agglomerates produced. Extrusion granulation is a method for producing agglomerates with relatively high density, in which a wet mass of a powder is cylindrically extruded through a small hole and is dried. These methods of granulation usually use binders. When a binder is used, it is usually removed, after granulation, by heating/sintering the agglomerates at a temperature of 500° C. or more and 1500° C. or less, for example. Even when no binder is used, the agglomerates are heated/sintered at a temperature of 500° C. or more and 1500° C. or less, for example. With this heating/sintering, degassing can be fully done and there can be easily obtained agglomerates having a mean particle diameter of 2 mm or more.

In the case where a binder is used in compression-molding or granulating the powder mixture, such a material as starch, wheat protein, or cellulose can be typically used as the binder, and other materials can of course be used as well. Usually, the binder is removed from the compression-molded or granulated one by heating/sintering.

According to the method of the invention, for producing an evaporation source material, the compression-molded or sintered evaporation source material for use in ion plating, in a predetermined shape, is advantageous in that plasma injected for film deposition concentrates at the evaporation source material and easily penetrates into it via the conductive material, causing efficiently the excitation of the evaporation source material. Consequently, there is deposited a gas barrier film having significantly enhanced gas barrier properties.

(Gas Barrier Sheet)

Figure 1:
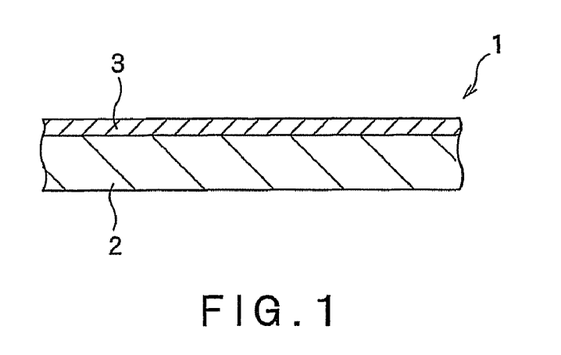
FIG. 1 is a diagrammatical cross-sectional view of a gas barrier sheet of the present invention.

FIG. 1 is a diagrammatic cross-sectional view of a gas barrier sheet of the present invention. A gas barrier sheet 1 of the invention comprises a substrate 2 and a gas barrier film 3 formed at least on one side of the substrate 2, as shown in FIG. 1. The gas barrier film 3 is formed from silicon oxide and a conductive material that is preferably zinc oxide or tin oxide. As mentioned in the above description of the powder mixture, zinc and tin are industrially advantageous because not only they themselves but also their oxides are electrically conductive. More specifically, the gas barrier film 3 is Si—O—Zn film in which the number of Si atoms, that of O atoms and that of Zn atoms are in the range of 100:(200-500):(2-100), and this number-of-atoms ratio is constant along the thickness of the film. Alternatively, the gas barrier film 3 is Si—O—Sn film in which the number of Si atoms, that of O atoms and that of Sn atoms are in the range of 100:(150-400):(2-60), and this number-of-atoms ratio is constant along the thickness of the film. Since the gas barrier sheet 1 comprises the gas barrier film 3 having film quality uniform along the thickness of the film, it is excellent in gas barrier properties.

The gas barrier film 3 has the function of blocking gas (typically oxygen and water vapor) penetration. The gas barrier film in the invention has excellent gas barrier properties, with an oxygen permeability of 1 cc/m$^2$/day·atom or less and a water vapor permeability of 1 g/m$^2$/day or less. The reason why the gas barrier film 3 has such excellent gas barrier properties is that, since the above-described evaporation source material of the invention, which is excited more efficiently than a conventional one, is used in ion plating as a source, the deposited film has high density, is dense, and is good in adhesive properties.

The thickness of the gas barrier film 3 is preferably 0.01 μm or more, more preferably 0.02 μm or more. A gas barrier film 3 with a thickness in the above range is excellent in impermeability to oxygen and waver vapor, and its oxygen permeability and water vapor permeability fall in the above respective ranges. The thickness of the gas barrier film 3 is preferably 1 μm or less, more preferably 0.2 μm or less. A gas barrier film 3 with a thickness in the above range causes decreased bending stress, so that it hardly cracks when the substrate on which it is deposited is a flexible film, and, moreover, its gas barrier properties scarcely deteriorate. Furthermore, since such a gas barrier film can be deposited in a shorter time, it is easy to increase productivity.

In the present invention, the expression "the number-of-atoms ratio is constant along the thickness of the film" means that the scattering of the number-of-atoms ratios determined along the thickness of the gas barrier film is within plus or minus 10%, preferably within plus or minus 5%. This range of scattering is characteristically obtained when the evaporation source material of the invention is used as a source in ion plating. Namely, the evaporation source material of the invention is obtained by compression-molding or granulating the powder mixture prepared by mixing silicon oxide powder with zinc oxide or tin oxide, a preferred conductive material powder, so that the gas barrier film deposited in ion plating using the evaporation source material has the above-described almost constant number-of-atoms ratio (scattering: within ±100%, preferably within ±5%) along the thickness of the film. The number-of-atoms ratio is herein on a bulk basis. The surface of the gas barrier film sometimes undergoes natural oxidation, and the film-substrate interface sometimes undergoes oxidation due to the gaseous matter emitted from the substrate. It is considered that the number-of-atoms ratio changes slightly in either case.

The number-of-atoms ratio can be obtained from measurements on an analyzer such as an ESCA. For example, when zinc oxide powder is used as the conductive material powder, electron spectroscopic measurement is made using an ESCA, model LAB 220i-XL, manufactured by VG Scientific Corp., England. A combination of a source of monochromatic Al X-rays having an Ag-3d-5/2 peak intensity of 300 Kcps to 1 Mcps and a slit with a diameter of about 1 mm was used as a source of X-rays. Setting a detector on the normal to the sample surface, measurement was made, and appropriate electrification corrections were made in the measurements obtained. The data obtained was analyzed with a software Eclipse version 2.1 contained in the ESCA, using the peaks corresponding to the binding energies of Si: 2p, Zn: 2p, C: 1s, and O: 1s. Each peak was subjected to Shirley background subtraction, and the peak area of each element was subjected to sensitivity correction (Zn=27.30, Si=0.865, and O=2.850 for C=1), whereby the number-of-atoms ratio was obtained. Taking the number of Si atoms as 100, the number of oxygen atoms and that of zinc atoms were calculated from the number-of-atoms ratio obtained. Even when the conductive material powder is composed of other material, e.g., tin oxide, measurement can be made in a manner almost the same as the above-described one.

The conductive material can provide the gas barrier film 3 with significantly enhanced gas barrier properties. Especially when zinc oxide or tin oxide is used, a gas barrier film 3 having higher density is deposited, so that it is easy to obtain enhanced gas barrier properties. The gas barrier properties of the gas barrier film 3 can be evaluated from the wavelength range of infrared absorption due to Si—O—Si stretching vibration and from the film density. Specifically, when the gas barrier film 3 is Si—O—Zn film, the infrared absorption due to Si—O—Si stretching vibration occurs in the range between 1005 cm$^{-1}$ and 1060 cm$^{-1}$, and the density of the film is preferably 2.2 g/cm$^3$ or more, more preferably 2.5 g/cm$^3$ or more, and preferably 2.7 g/cm$^3$ or less. When the number-of-atoms ratio in the gas barrier film, the wavelength range of infrared absorption due to Si—O—Si stretching vibration, and the film density are in the above respective ranges, it is easy to ensure denseness for the gas barrier film 3, and the gas barrier film 3 can exhibit excellent gas barrier properties (an oxygen permeability of 1 cc/m$^2$/day·atom or less and a water vapor permeability of 1 g/m$^2$/day or less). Moreover, such a gas barrier film 3 can have flexibility and enhanced durability.

In the present invention, the wavelength range of infrared absorption due to Si—O—Si stretching vibration is determined using a Fourier transform infrared spectrophotometer, model Herschel FT-IR-610, manufactured by Nippon Bunko Kabushiki Kaisha, Japan, equipped with apparatus for multiple reflection (ATR) measurement. Further, the above-described film density is measured with an X-ray reflectometer, model ATX-E, manufactured by Rigaku Denki Kabushiki Kaisha, Japan. Although various apparatus for measurement can be used to evaluate gas barrier properties, the above gas barrier properties, i.e., oxygen permeability and water vapor permeability, were measured with apparatus PARMATRAN 3/31 manufactured by Mocon Corp. under the conditions of 37.8° C. and 100% RH.

When the gas barrier sheet of the invention requires transparency, the substrate 2 is preferably a material having high transparency. Specifically, gas barrier sheets whose transmission rates for light of 400-700 nm are 80% or more can be favorably used for display media, lighting fixtures, covers of solar cells, etc. that are needed to transmit light, and for packaging materials, containers, etc. that are needed to be transparent so that their contents can be seen through them. On the other hand, gas barrier sheets having light transmission rates of about 50% are good enough for those objects that are not needed to be transparent and can be used as ordinary gas barrier sheets for purposes other than the above-described ones. The term "light transmission rate" is herein used interchangeably with "total light transmittance". However, the total light transmittance can be optically adjusted by controlling film thickness and refractive index, so that this value can be used as a measure but is not always applicable strictly.

In FIG. 1, the gas barrier film 3 is formed on one side of the substrate 2. The present invention, however, is not limited to this embodiment and encompasses other embodiments. For example, gas barrier films may be formed on each side of the substrate 2, or a gas barrier film may be deposited on a resin layer formed on one side of the substrate 2. Moreover, gas barrier films may be deposited on resin layers formed on each side of the substrate 2, and the resin layer and the gas barrier film may be repeatedly layered two times or more. On the gas barrier film 3, a hard coat layer, a non-scratching layer, a conductive layer, an anti-reflection layer, etc. may be formed, as needed. Furthermore, the gas barrier film 3 may be a multi-layered film.

On the substrate 2 is deposited the evaporation source material for use in ion plating, and any substrate can be used in the present invention. A substrate in sheet or film form is typically used as the substrate 2, and either a non-flexible or flexible substrate can be used depending on the intended use or purpose of the gas barrier sheet finally obtained. Examples of substrates useful herein include non-flexible substrates such as glass plates, hard resin boards, wafers, printed circuit boards, a variety of cards and resin sheets, and flexible substrates made from polyethylene terephthalate (PET), polyamides, polyolefins, polyethylene naphthalate (PEN), polycarbonate, polyacrylate, polymethacrylate, polyurethane acrylate, polyether sulfone, polyimide, polysilsesquioxanes, polynorbornene, polyether imide, polyallylates, and cyclic polyolefins. To make a resin-made substrate 2, the use of a resin capable of withstanding temperatures of preferably 100° C. or more, more preferably 150° C. or more, is adequate.

Although the substrate 2 can have any thickness, the thickness of the substrate is usually made 6 µm or more, preferably 12 µm or more, and usually 400 µm or less, preferably 250 µm or less, with consideration for flexibility and shape retention.

A resin layer (not shown in the figure) is formed between the substrate 2 and the gas barrier film 3 in order to increase the adhesion between them and to enhance gas barrier properties. A resin layer (not shown in the figure) covering the gas barrier layer 3 serves as a protective film and provides the gas barrier sheet with heat resistance, chemical resistance and weathering resistance. Moreover, even when the gas barrier film 3 has voids, the voids are filled with the resin layer, so that the gas barrier film 3 can have excellent gas barrier properties. Examples of such resin layers useful herein include layers of commercially available resin materials such as polyamic acid resins, polyethylene resins, melamine resins, polyurethane resins, polyester resins, polyol resins, polyurea resins, polyazomethine resins, polycarbonate resins, polyacrylate resins, polystyrene resins, polyacrylonitrile (PAN) resins and polyethylene naphthalate (PEN) resins; curable epoxy resins containing high-molecular-weight epoxy polymers of bifunctional epoxy resins and bifunctional phenols; and one of, or two or more of the resin materials used for the substrate. It is preferable to determine the thickness of the resin layer according to the material to be used to form the resin layer, and it can be set to a value between 5 nm and 500 µm, for example.

In such a resin layer may be incorporated a non-fibrous inorganic filler with a mean particle diameter of 0.8 to 5 µm. Examples of non-fibrous inorganic fillers useful herein include aluminum hydroxide, magnesium hydroxide, talc, alumina, magnesia, silica, titanium dioxide, and clay. Of these fillers, calcined clay is particularly preferred. Such an inorganic filler can be incorporated in the resin layer usually in an amount of 10% by weight or more, preferably 25% by weight or more, and usually 60% by weight or less, preferably 45% by weight or less, of the resin layer.

According to the gas barrier sheet of the present invention, there can be obtained a gas barrier sheet having a gas barrier film whose film quality is uniform along the thickness of the film, since the gas barrier film has a number-of-atoms ratio constant along the thickness of the film (scattering: within ±10%). More specifically, there can be obtained a gas barrier sheet having significantly enhanced gas barrier properties since it has a gas barrier film having film quality uniform along the thickness of the film, as well as high density, denseness, and excellent adhesive properties. The gas barrier sheet of the invention, having the above advantageous features, can be applied to various objects that require gas barrier properties. For example, the gas barrier sheet of the invention can be used as part of materials to be used for packaging various foods and drinks, chemicals such as adhesives and pressure-sensitive adhesives, cosmetics, pharmaceuticals, sundry goods such as chemical self-warmers, and electronic parts. The gas barrier sheet can also be used for components of liquid crystal displays. It is particularly preferable to use the gas barrier sheet in the area of foods because there is an insistent demand for reduction in the cost of packaging materials in this area.

(Method of Producing Gas Barrier Sheet)

A method of the invention, for producing a gas barrier sheet, comprises the steps of preparing an evaporation source material for use in ion plating, in a predetermined form, by compression-molding or granulating a powder mixture comprising 100 parts by weight of silicon oxide powder having a mean particle diameter of 100 µm or less, preferably 5 µm or less, and 5 parts by weight or more and 100 parts by weight or less of a conductive material powder having a mean particle diameter of 100 µm or less, preferably 5 µm or less, and depositing a gas barrier film on a substrate by ion plating using as a source the evaporation source material.

In the production method of the invention, the powder mixture, the evaporation source material and the gas barrier sheet are the same as those described above. For example, as mentioned previously, it is preferred that the conductive material be at least one compound selected from electrically conductive metallic oxides, nitrides and acid nitrides. Therefore, the powder mixture, the evaporation source material, and the gas barrier sheet will not be explained any more. Further, the manner in which the powder mixture is made into the evaporation source material by compression molding or granulation is also as explained in the above description of the method of producing an evaporation source material, so that it will not be explained any more.

Figure 2:
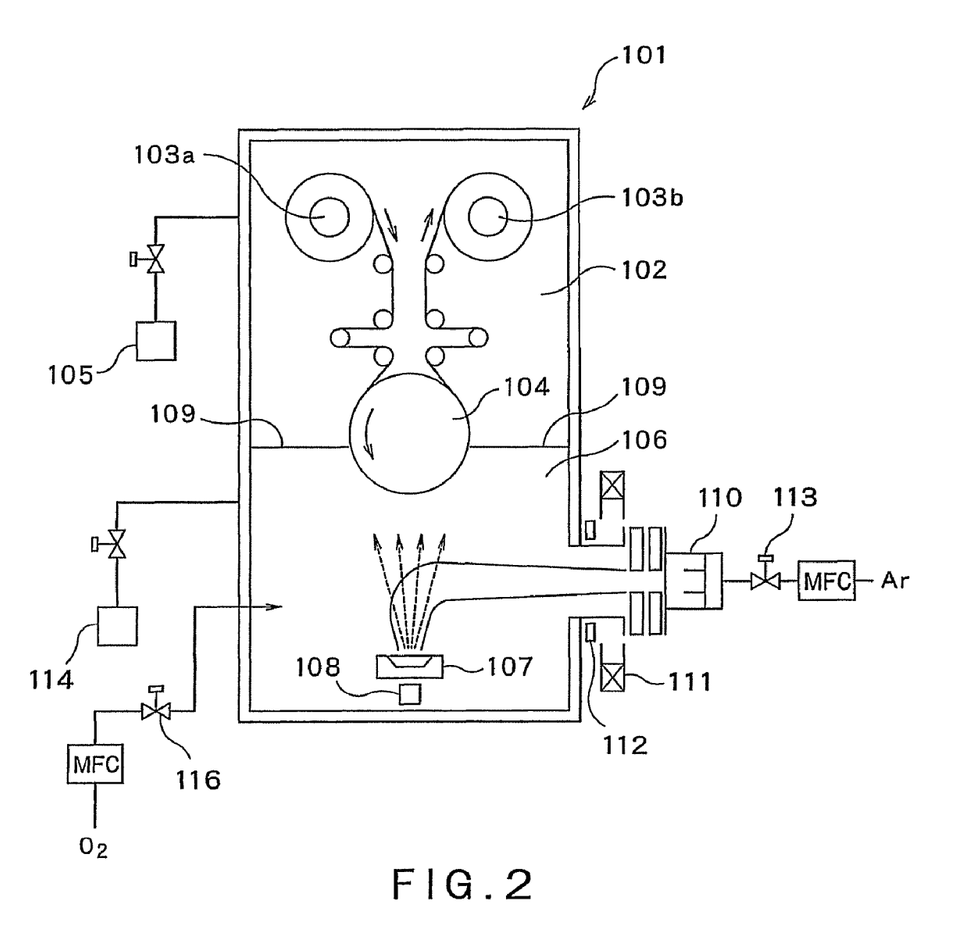
FIG. 2 is a view showing the structure of an ion-plating device of hollow cathode type that was used in Examples.

FIG. 2 is a view showing the structure of an ion-plating device, and more particularly, it is a view showing the structure of an ion-plating device of hallow cathode type that was used in the following Examples. A hollow-cathode-type ion-plating device 101 shown in FIG. 2 comprises a vacuum chamber 102; a feed roll 103a, a wind-up roll 103b and a coating drum 104, which are situated in the chamber 102; a vacuum exhaust pump 105 connected to the vacuum chamber 102 by a valve; screens 109, 109; a deposition chamber 106 separated from the vacuum chamber 102 by the screens 109, 109; a crucible 107 placed in the deposition chamber 106 at its bottom; an anode magnet 108; a pressure gradient plasma gun 110 situated in a predetermined position on the deposition chamber 106 (in the example shown in the figure, on the right-hand sidewall of the deposition chamber); a focusing coil 111; a sheeted magnet 112; a valve 113 for controlling the rate at which argon gas is fed to the pressure gradient plasma gun 110; a vacuum exhaust pump 114 connected to the deposition chamber 106 by a valve; and a valve 116 for controlling the feed rate of oxygen gas. As shown in the figure, the feed roll 103a and the wind-up roll 103b are provided with a reverse mechanism, so that a substrate can be unwound or wound in either direction.

Deposition of a gas barrier film, using the ion-plating device 101, is conducted in the following manner. The vacuum chamber 102 and the deposition chamber 106 are first evacuated to a specified vacuum by the vacuum exhaust pumps 105, 114, respectively, and then oxygen gas is fed to the deposition chamber 106 at a predetermined rate. By manipulating the valve in the line connecting the vacuum exhaust pump 114 and the deposition chamber 106, the chamber 106 is held at a specified pressure. While letting a substrate film run, electric power for plasma generation is supplied to the pressure gradient plasma gun 110 to which argon gas has been fed at a predetermined rate. A stream of plasma is made to concentrate at the crucible 107 placed on the anode magnet 108, thereby vaporizing the evaporation source material. Evaporating molecules are ionized by the high-density plasma and are deposited on the substrate to form an intended gas barrier film. In this manner, a gas barrier sheet is obtained.

The present invention is characterized in that the aforementioned evaporation source material of the invention, for use in ion plating, is used as a source. In ion plating using the evaporation source material, plasma injected for film deposition concentrates at the evaporation source material and easily penetrates into it via the conductive material, causing efficiently the excitation of the evaporation source material. Consequently, there is deposited a gas barrier film having significantly enhanced gas barrier properties.

EXAMPLES

The present invention will now be described more specifically by referring to the following Examples. However, these examples are not intended to limit or restrict the scope of the invention in any way.

Example 1

A powder mixture according to the present invention was obtained by mixing 100 parts by weight of silicon dioxide ($SiO_2$) powder (manufactured by Tosoh Silica Corporation, Japan; mean particle diameter determined by the Coulter Counter method using apparatus for particle size distribution measurement: 2 µm; specific surface area determined by the nitrogen adsorption method, using an automatic specific surface area meter and the BET equation: 800 $m^2/g$) with 30 parts by weight of zinc oxide (ZnO) powder (manufactured by Kojundo Kagaku Kabushiki Kaisha, Japan; mean particle diameter determined by the Coulter Counter method using apparatus for particle size distribution measurement: 0.5 µm; volume resistivity measured by the testing method using a four-point probe array, specified in JIS-K7194: 10 Ω·cm).

While adding dropwise a 2% aqueous cellulose solution, a binder, to the powder mixture, the mixture was rolled, thereby making it into a spherical block with a diameter of 10 mm, which was placed in an oven at a temperature of 1000° C. for 1 hour. In this manner, there was obtained an evaporating source material of the invention, for use in ion plating, in the form of a block with a diameter of 7 mm. Using an X-ray spectroscopic analyzer (XPS/ESCA), the composition, by weight, of the evaporation source material obtained was determined. The result was that the weight ratio of the zinc oxide to the silicon dioxide in the evaporation source material was 30 to 100. This was nearly equal to the ratio at which the zinc oxide powder had been initially mixed with the silicon dioxide powder.

On the other hand, a plastic film of PEN resin, having a thickness of 100 µm (Q65 manufactured by Teijin DuPoint Films Japan Limited, Japan), serving as the transparent film substrate, was dried in a drier at 160° C. for 1 hour and then set between the feed roll 103a and the wind-up roll 103b in the hollow-cathode-type ion-plating device having the structure shown in FIG. 2.

Next, after placing the evaporation source material in the crucible in the ion-plating device, a vacuum was drawn on the inside of the device. When the vacuum reached $5\times10^{-4}$ Pa, argon gas was fed to the plasma gun at a rate of 15 sccm to generate plasma with a current of 110 A and a voltage of 90V. While maintaining the inside of the chamber at $1\times10^{-3}$ Pa, the magnetic force was exerted to the plasma to bend it to a predetermined direction, thereby concentrating the plasma at the evaporation source material. It was confirmed that the evaporation source material in the crucible was evaporated after it had been melted. By conducting ion plating for five seconds using as a source the evaporation source material, a $SiO_aZn_b$ gas barrier film with a thickness of 30 nm was deposited on the substrate. The unit "sccm" used herein and also in the following Examples and Comparative Examples is the abbreviation of standard cubic centimeter per minute.

The composition of the gas barrier film was determined using an ESCA (model LAB 220i-XL, manufactured by VG Scientific Corp., England). a and b in $SiO_aZn_b$ were 2.6 and 0.35, respectively, and the ratio Si:O:Zn was therefore 100:264:35. In this measurement using the ESCA, a combination of a source of monochromatic Al X-rays having an Ag-3d-5/2 peak intensity of 300 Kcps to 1 Mcps and a slit with a diameter of about 1 mm was used as a source of X-rays. Setting a detector on the normal to the sample surface, measurement was made, and appropriate electrification corrections were made in the measurements obtained. The data obtained was analyzed with a software Eclipse version 2.1 contained in the ESCA, using the peaks corresponding to the binding energies of Si: 2p, Zn: 2p, C: 1s, and O: 1s. Each peak was subjected to Shirley background subtraction, and the peak area of each element was subjected to sensitivity correction (Zn=27.30, Si=0.865, and O=2.850 for C=1), whereby the number-of-atoms ratio was obtained. Taking the number of Si atoms as 1 or 100, the number of oxygen atoms and that of zinc atoms were calculated from the number-of-atoms ratio obtained.

The water vapor permeability, a measure of gas barrier properties, of the gas barrier film was determined using apparatus for water vapor permeability measurement (model PERMATRAN-W 3/31, manufactured by MOCON Corp.) under the conditions of 37.8° C. and 100% RH; it was $1.4\times10^{-2}$ g/m²/day. The oxygen gas permeability, another measure of gas barrier properties, of the gas barrier film was determined using apparatus for oxygen gas permeability measurement (model OX-TRAN 2/20, manufactured by MOCON Corp.) under the conditions of 23° C. and 90% RH, with individual zero measurement for background subtraction. The gas barrier film was found to have an oxygen gas permeability of $3.5\times10^{-1}$ cc/m²/day·atom.

Example 2

A $SiO_aZn_b$ gas barrier film with a thickness of 30 nm was obtained in the same manner as in Example 1, except that the powder mixture of the invention was prepared by using 15 parts by weight of the zinc oxide (ZnO) powder for 100 parts by weight of the silicon dioxide powder. Measurement using the ESCA was made in the same manner as in Example 1. a and b in $SiO_aZn_b$ were 2.2 and 0.1, respectively, and the ratio Si:O:Zn was therefore 100:224:12. The water vapor permeability and oxygen gas permeability of the gas barrier film obtained were measured; the former was $5.6\times10^{-1}$ g/m²/day and the latter $6.5\times10^{-1}$ cc/m²/day·atom.

Example 3

A $SiO_aZn_b$ gas barrier film with a thickness of 25 nm was obtained in the same manner as in Example 1, except that the powder mixture of the invention was prepared by using 70 parts by weight of the zinc oxide (ZnO) powder for 100 parts by weight of the silicon dioxide powder. Measurement using the ESCA was made in the same manner as in Example 1. a and b in $SiO_aZn_b$ were 3.2 and 0.7, respectively, and the ratio Si:O:Zn was therefore 100:321:65. The water vapor permeability and oxygen gas permeability of the gas barrier film obtained were measured; the former was $5.0\times10^{-2}$ g/m²/day and the latter $2.4\times10^{-1}$ cc/m²/day·atom.

Example 4

A powder mixture according to the invention was prepared by mixing 100 parts by weight of silicon dioxide ($SiO_2$) powder (manufactured by Admatex Kabushiki Kaisha, Japan; mean particle diameter determined by the Coulter Counter method using apparatus for particle size distribution measurement: 0.5 μm; specific surface area obtained by the nitrogen adsorption method, using an automatic specific surface area meter and the BET equation: 6.8 m²/g) with 30 parts by weight of tin oxide (SnO) powder.

While adding dropwise a 3% aqueous cellulose solution, a binder, to the powder mixture, the mixture was rolled, followed by stirring one over night. Thereafter, the mixture was dried and then powdered in a mortar. Subsequently, the powder was placed in a 62 mm-square metal mold and was press-molded with a pressure of 0.2 t/cm². The press-molded product was vacuum-packaged and then compression-molded with a pressure of 1.3 t/cm² using a CI press process. The compression-molded product was placed in an oven at 500° C. for 24 hours, thereby obtaining an evaporation source material of the invention, for use in ion plating, in the form of a 50 mm-square block. Using an X-ray spectroscopic analyzer (XPS/ESCA), the composition, by weight, of the evaporation source material obtained was determined. The result was that the weight ratio of the tin oxide to the silicon dioxide in the evaporation source material was 30 to 100. This was nearly equal to the ratio at which the tin oxide powder had been initially mixed with the silicon dioxide powder.

On the other hand, using, as the transparent film substrate, a PEN resin film with a thickness of 100 μm (Q65 manufactured by Teijin DuPoint Films Japan Limited, Japan) that had been dried in a drier at 160° C. for 1 hour, ion plating was conducted in the same manner as in Example 1. In this manner, there was obtained a $SiO_aSn_b$ gas barrier film deposited on the substrate.

The composition of the gas barrier film was determined using an ESCA (model LAB 220i-XL, manufactured by VG Scientific Corp., England). It was found that the ratio Si:O:Sn was 100:202:14. The thickness of the gas barrier film was 93 nm.

The water vapor permeability, a measure of gas barrier properties, of the gas barrier film was determined using apparatus for water vapor permeability measurement (model PERMATRAN-W 3/31, manufactured by MOCON Corp.) under the conditions of 37.8° C. and 100% RH; it was $1.2\times10^{-2}$ g/m²/day. The oxygen gas permeability, another measure of gas barrier properties, of the gas barrier film was also determined using apparatus for oxygen gas permeability measurement (model OX-TRAN 2/20, manufactured by MOCON Corp.) under the conditions of 23° C. and 90% RH, with individual zero measurement for background subtraction. The gas barrier film was found to have an oxygen gas permeability of $2.2 \times 10^{-1}$ cc/m²/day·atom.

Example 5

A $SiO_aSn_b$ gas barrier film was obtained in the same manner as in Example 4, except that the powder mixture of the invention was prepared by using 60 parts by weight of the tin oxide (SnO) powder for 100 parts by weight of the silicon dioxide powder. Measurement using the ESCA was made in the same manner as in Example 4. It was found that the composition (Si:O:Sn) of the gas barrier film was 100:232:26. The thickness of the gas barrier film was 87 nm. Further, the water vapor permeability and oxygen gas permeability of the gas barrier film formed were measured; the former was $0.9 \times 10^{-2}$ g/m²/day and the latter $1.9 \times 10^{-2}$ cc/m²/day·atom.

Example 6

A powder mixture according to the invention was prepared by mixing 100 parts by weight of silicon dioxide ($SiO_2$) powder (manufactured by Admatex Kabushiki Kaisha, Japan; mean particle diameter determined by the Coulter Counter method using apparatus for particle size distribution measurement: 0.5 μm; specific surface area obtained by the nitrogen adsorption method using an automatic specific surface area meter and the BET equation: 6.8 m²/g) with 30 parts by weight of metallic tin (Sn) powder (manufactured by Kojundo Kagaku Kabushiki Kaisha, Japan, mean particle diameter: 63 μm).

While adding dropwise a 3% aqueous cellulose solution, a binder, to the powder mixture, the mixture was rolled, followed by stirring one over night. The mixture was dried and then powdered in a mortar. Subsequently, the powder was placed in a 62 mm-square metal mold and was press-molded with a pressure of 0.2 t/cm². The press-molded product was vacuum-packaged and then compression-molded with a pressure of 1.3 t/cm² using a CI press process. The compression-molded product was placed in an oven at 500° C. for 24 hours, thereby obtaining an evaporation source material of the invention, for use in ion plating, in the form of a 50 mm-square block.

On the other hand, using, as the transparent film substrate, a PEN resin film with a thickness of 100 μm (Q65 manufactured by Teijin DuPoint Films Japan Limited, Japan) that had been dried in a drier at 160° C. for 1 hour, ion plating was conducted in the same manner as in Example 1. In this manner, there was obtained a $SiO_aSn_b$ gas barrier film deposited on the substrate.

The composition of the gas barrier film was determined using an ESCA (model LAB 220i-XL, manufactured by VG Scientific Corp., England). It was found that the ratio Si:O:Sn was 100:155:21. The thickness of the gas barrier film was 74 nm.

The water vapor permeability, a measure of gas barrier properties, of the gas barrier film was determined using apparatus for water vapor permeability measurement (model PERMATRAN-W 3/31, manufactured by MOCON Corp.) under the conditions of 37.8° C. and 100% RH; it was $1.4 \times 10^{-2}$ g/m²/day. The oxygen gas permeability, another measure of gas barrier properties, of the gas barrier film was also determined using apparatus for oxygen gas permeability measurement (model OX-TRAN 2/20, manufactured by MOCON Corp.) under the conditions of 23° C. and 90% RH, with individual zero measurement for background subtraction. The gas barrier film was found to have an oxygen gas permeability of $1.8 \times 10^{-2}$ cc/m²/day·atom.

Comparative Example 1

A $SiO_cZn_d$ gas barrier film with a thickness of 32 nm was obtained in the same manner as in Example 1, except that the powder mixture was prepared by using 3 parts by weight of the zinc oxide powder, serving as the conductive material powder, for 100 parts by weight of the silicon dioxide powder. Measurement using the ESCA was made in the same manner as in Example 1. c and d in $SiO_cZn_d$ were 2.1 and 0.04, respectively, and the ratio Si:O:Zn was therefore 100:205:4. The water vapor permeability oxygen and oxygen gas permeability of the gas barrier film were measured; the former was 2.5 g/m²/day and the latter 2.5 cc/m²/day·atom.

Comparative Example 2

A $SiO_e$ gas barrier film with a thickness of 35 nm was obtained in the same manner as in Example 1, except that the zinc oxide powder, a conductive material powder, was not used. Measurement using the ESCA was made in the same manner as in Example 1. e in $SiO_e$ was 2.2. The water vapor permeability oxygen and oxygen gas permeability of the gas barrier film were measured; the former was 2.5 g/m²/day and the latter 2.7 cc/m²/day·atom.

The invention claimed is:

1. A gas barrier sheet comprising a substrate and a gas barrier film formed at least on one side of the substrate, the gas barrier film being Si—O—Zn film in which the number of Si atoms, that of O atoms and that of Zn atoms is in the ratio of 100:(200-500):(2-100), the ratio being constant along the thickness of the film.

* * * * *